United States Patent
Yu

(10) Patent No.: US 6,225,173 B1
(45) Date of Patent: May 1, 2001

(54) RECESSED CHANNEL STRUCTURE FOR MANUFACTURING SHALLOW SOURCE/DRAIN EXTENSIONS

(75) Inventor: Bin Yu, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,172

(22) Filed: Nov. 6, 1998

(51) Int. Cl.$^7$ .................................................. H01L 21/336
(52) U.S. Cl. .......................... 438/301; 438/183; 438/199; 438/291; 438/300; 438/595
(58) Field of Search .................................. 938/183, 199, 938/218, 259, 270, 269, 289, 275, 291, 300, 595

(56) References Cited

U.S. PATENT DOCUMENTS

| | | |
|---|---|---|
| 4,683,645 | 8/1987 | Naguib et al. . |
| 4,745,082 | 5/1988 | Kwok . |
| 4,784,718 | 11/1988 | Mitani et al. . |
| 5,017,504 * | 5/1991 | Nishimura et al. . |
| 5,264,382 | 11/1993 | Watanabe . |
| 5,270,232 * | 12/1993 | Kimura et al. . |
| 5,374,575 | 12/1994 | Kim et al. . |
| 5,391,510 | 2/1995 | Hsu et al. . |
| 5,393,685 | 2/1995 | Yoo et al. . |
| 5,429,956 | 7/1995 | Shell et al. . |
| 5,434,093 * | 7/1995 | Chau et al. . |
| 5,538,913 * | 7/1996 | Hong . |
| 5,576,227 * | 11/1996 | Hsu . |
| 5,593,907 | 1/1997 | Anjum et al. . |
| 5,607,884 | 3/1997 | Byun . |
| 5,675,159 | 10/1997 | Oku et al. . |
| 5,716,861 | 2/1998 | Moslehi . |
| 5,736,435 * | 4/1998 | Vankatesan et al. . |
| 5,793,090 | 8/1998 | Gardner et al. . |
| 5,801,075 * | 9/1998 | Gardner et al. . |
| 5,811,323 | 9/1998 | Miyasaka et al. . |
| 5,814,544 * | 9/1998 | Huang . |
| 5,817,558 * | 10/1998 | Wu . |
| 5,824,586 * | 10/1998 | Wollesen et al. . |
| 5,825,066 | 10/1998 | Buynoski . |
| 5,856,225 * | 1/1999 | Lee et al. . |
| 5,858,843 | 1/1999 | Doyle et al. . |
| 5,904,530 * | 5/1999 | Shin . |
| 5,915,180 * | 6/1999 | Hara et al. . |
| 5,915,183 * | 6/1998 | Gambino et al. . |
| 5,937,297 * | 6/1998 | Peidous . |
| 5,953,602 * | 9/1999 | Oh et al. . |
| 5,972,754 * | 6/1998 | Ni et al. . |
| 5,998,288 * | 12/1999 | Gardner et al. . |

FOREIGN PATENT DOCUMENTS

| | | |
|---|---|---|
| 3-248433 | 11/1991 | (JP) . |
| 4-123439 | 4/1992 | (JP) . |
| 5-160396 | 6/1993 | (JP) . |

OTHER PUBLICATIONS

"Sub 50–nm Fin FET: PMOS" Huang, et al. 1999 IEEE.
"Ultra–Thin–Body Silicon–On–Insulator MOSFET's for Terabit–Scale Integration" Yu, et al., 12/97.
IEDM Technical Digest International Electronic Device Meeting 1997 "Sub–100nm Gate Length Metal Gate NMOS Transistors Fabricated by a Replacement Gate Process" by Chatterjee, et al. 1997 IEEE.

* cited by examiner

Primary Examiner—John F. Niebling
Assistant Examiner—Jonathan Hack
(74) Attorney, Agent, or Firm—Foley & Lardner

(57) ABSTRACT

A method of fabricating an integrated circuit with ultra-shallow source and drain junctions utilizes a damascene process. The substrate is over-etched to form extensions in the source and drain regions. The process can be utilized for P-channel or N-channel metal oxide field semiconductor effect transistors (MOSFETS).

20 Claims, 1 Drawing Sheet

US 6,225,173 B1

RECESSED CHANNEL STRUCTURE FOR MANUFACTURING SHALLOW SOURCE/DRAIN EXTENSIONS

CROSS REFERENCE TO RELATED APPLICATIONS

This patent application is related to U.S. application Ser. No. 09/187,630, by Yu, entitled "Dual Amorphization Implant Process for Ultra-Shallow Drain and Source Extensions", U.S. application Ser. No. 09/187,635 by Yu, et al., entitled "A Damascene Process for Forming Ultra-Shallow Source/Drain Extensions", and U.S. application Ser. No. 09/187,890, by Yu, entitled "A Method of Fabricating an Integrated Circuit with Ultra-Shallow Source and Drain Extensions", all filed on an even date herewith and assigned to the assignee of the present invention.

FIELD OF THE INVENTION

The present invention relates to integrated circuits and methods of manufacturing integrated circuits. More particularly, the present invention relates to a method of manufacturing integrated circuits having transistors with ultra-shallow source/drain extensions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects, which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions, as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source and drain extensions have become more difficult to manufacture. For example, smaller transistors should have ultra-shallow source and drain extensions (less than 30 nanometer (nm) junction depth). Forming source and drain extensions with junction depths of less than 30 nm is very difficult using conventional fabrication techniques. Conventional ion implantation and diffusion doping techniques make transistors on the IC susceptible to short-channeling effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extensions vertically into the bulk semiconductor substrate.

Thus, there is a need for a method of manufacturing ultra-shallow source and drain extensions that does not utilize a conventional double implant process. Further still, there is a need for transistors that have ultra-shallow junction source and drain extensions. Even further still, there is a need for an efficient method of manufacturing source and drain extensions.

SUMMARY OF THE INVENTION

The present invention relates to a method of manufacturing an integrated circuit. The method includes providing a plurality of gate structures between a source region and a drain region in a semiconductor substrate, each of the gate structures includes a dummy material. The method also includes removing the dummy material, thereby leaving a cavity, etching a recess in the substrate within the cavity and partially in the source region and in the drain region. The recess forms an ultra-shallow source extension and an ultra-shallow drain extension. The method also includes providing a doped semiconductor material, in the cavity.

The present invention further relates to a method of manufacturing an ultra-large scale integrated circuit including a plurality of field effect transistors. Each transistor has a source, a drain, and a gate structure disposed between the source and the drain. The gate structure includes a first gate material disposed over a gate oxide. The method includes steps of depositing an insulative material over the top surface of the semiconductor substrate and over the gate structures, removing a portion of the insulative material to expose the first gate material, removing the first gate material from the gate structures, removing the gate oxide, etching the substrate underneath the gate oxide, providing a thin gate oxide, and providing a second gate material in the gate structure.

The method even further relates to a damascene gate process of forming shallow source and drain extensions. The process includes steps of providing a plurality of transistors that include a source region, a drain region, and at least a portion of a gate structure on a top surface of a silicon substrate. The gate structure includes a gate connector located between the source region and the drain region. The process further includes steps of removing the gate conductor from the gate structure, thereby leaving a cavity in the gate structure, and etching within the cavity to provide a recessed portion in the top surface of the substrate, thereby forming the shallow source and drain extensions.

DETAILED DESCRIPTION OF THE PREFERRED EXEMPLARY EMBODIMENTS

Figure 1:
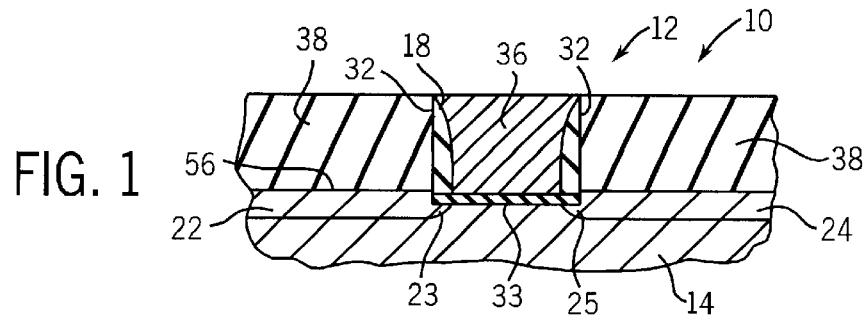
FIG. 1 is a cross-sectional view of a portion of an integrated circuit having a transistor with shallow source and drain extensions in accordance with an exemplary embodiment of the present invention.

With reference to FIG. 1, a portion 10 of an integrated circuit (IC) includes a transistor 12 disposed on a semiconductor substrate 14, such as, a single crystal silicon wafer. Alternatively, substrate 14 can be other semiconductor materials. Transistor 12 is part of the integrated circuit (IC) manufactured on a wafer (such as, a single crystaline silicon wafer).

Transistor 12 includes a gate structure 18, a source region 22, and a drain region 24. Transistor 12 also includes a source extension 23 and a drain extension 25. Gate structure 18 is disposed between region 22 and region 24.

Extensions 23 and 25 are preferably ultra-shallow extensions (e.g., junction depth or thickness less than 30 nanometers (nm)), which are thinner than regions 22 and 24. Alternatively, extensions 23 and 25 can have a thickness as large as 60 nm. Extensions 23 and 25 are connected to regions 22 and 24, respectively, and are disposed partially underneath a gate oxide 33. Ultra-shallow extensions 23 and 25 help transistor 12 achieve substantial immunity to short-channel effects. Short-channel effects can degrade performance of transistor 12, as well as the manufacturability of the IC associated with transistor 12.

Gate oxide 33 can be a 2–5 nm thick layer of thermally grown silicon dioxide. Alternatively, gate oxide 33 can be a silicon nitride ($Si_3N_4$) material. Transistor 12 can be an N-channel or a P-channel field effect transistor, such as, a metal oxide semiconductor field effect transistor (MOSFET). Transistor 12 is preferably part of an ultra-large scale integrated (ULSI) circuit that includes one million or more transistors.

Gate structure 18 includes a spacer 32, gate oxide 33, and a polysilicon gate conductor 36. Spacer 32 and conductor 36 are preferably deposited by chemical vapor deposition (CVD) and selectively etched to form the particular structures for transistor 12. Spacer 32 is preferably silicon dioxide or silicon nitride.

An insulative layer 38 is provided over regions 22 and 24. Layer 38 can be provided by a low temperature (under 500° C.) CVD process over substrate 14 and structure 18 and subsequently polished by a chemical mechanical polish technique (CMP) to reduce the level of layer 38 to be approximately the same layer level as material 36. Layer 38 is preferably silicon dioxide deposited in a tetraorthosilicate (TEOS) process and is initially approximately 300 to 500 nm thick.

Exemplary dimension for structures shown in FIG. 1 are described below. Conductor 36 preferably has a width of 100 to 250 nm and a thickness of 100 to 200 nm. Oxide 33 is preferably thermally grown to a thickness of 2–5 nm. Oxide 33 is located below a top surface 56 of substrate 14 (above the bottom of the recess which forms extensions 23 and 25 out of regions 22 and 24).

Figure 2:
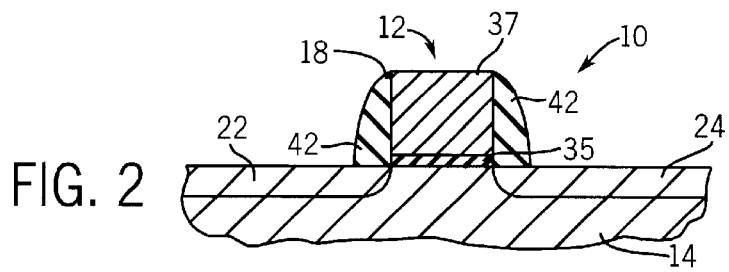
FIG. 2 is a cross-sectional view of the portion of the integrated circuit illustrated in FIG. 1, showing a gate structure with a dummy polysilicon material.

The fabrication of portion 10 is described below, with reference to FIGS. 1–5 as follows. With reference to FIGS. 1–5, the fabrication of transistor 12, including source extension 23 and drain extension 25, is described below as follows. In FIG. 2, transistor 12 can be substantially formed by conventional semiconductor processing techniques to form gate structure 18, including a sacrificial gate oxide 35, a dummy gate material 37, source region 22, and drain region 24. Additionally, spacers 42 are provided partially over source region 22 and drain region 24. Spacers 42 are sacrificial spacers. Spacers 42 are preferably formed by depositing silicon dioxide over gate structure 18 and selectively etching the silicon dioxide to leave spacers 42. Spacers 42 preferably have a width of approximately 30–80 nm.

After spacers 42 are provided, substrate 14 is doped in an ion implantation process to form source region 22 and drain region 24. Regions 22 and 24 extend deeply below a top surface 43 of substrate 14 (FIG. 2). Alternatively, a diffusion technique can be utilized to form regions 22 and 24. Source region 22 and drain region 24 can be heavily doped with boron or phosphorous, depending upon the type of transistor 12. Alternatively, other dopants can be utilized.

Dummy gate 37 is undoped polysilicon which is preferably protected when source region 22 and drain region 24 are doped. Alternatively, material 37 can be any semiconductive material. Gate oxide 35 is thermally grown silicon dioxide that is 10–20 nm thick.

Substrate 14 is subject to a rapid thermal annealing process to appropriately diffuse dopants within regions 22 and 24 substrate 14. By utilizing a damascene process, portion 10 can be created with a self-aligned process. Gate structure 18 including dummy gate material 37, sacrifical spacers 42 and sacrificial gate oxide 35 serves to precisely position regions 22 and 24 with respect to structure 18.

Figure 3:
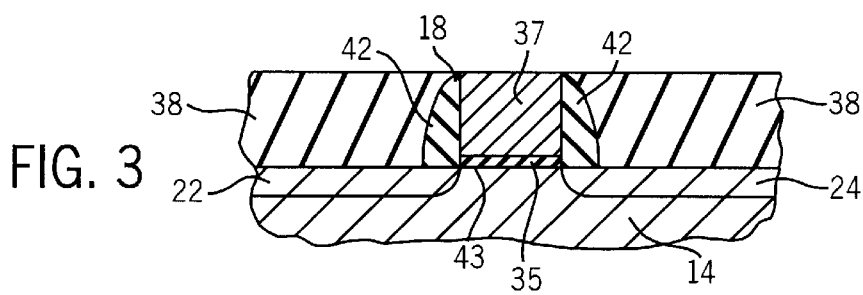
FIG. 3 is a cross-sectional view of the portion of the integrated circuit illustrated in FIG. 1, showing an insulation deposition step.
Figure 4:
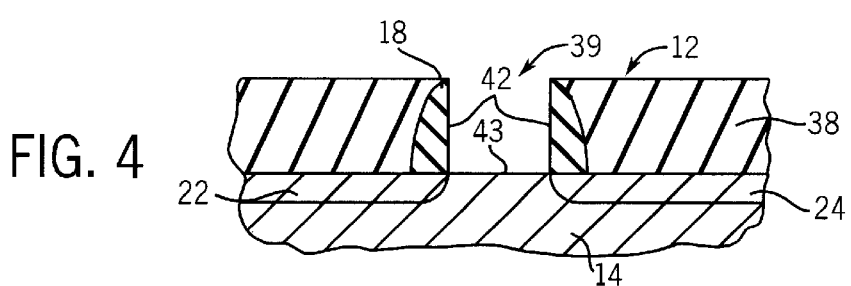
FIG. 4 is a cross-sectional view of the portion of the integrated circuit illustrated in FIG. 1, showing a dummy polysilicon material removal step.

In FIG. 3, layer 38 is deposited over structure 18 and reduced by a CMP process to expose material 37. In FIG. 4, material 37 is removed, thereby leaving a cavity 39 in gate structure 18. Additionally, oxide 35 is removed to expose top surface 43 of substrate 14 between source region 22 and drain region 24 of transistor 12. Material 37 can removed by a wet chemical etch to reach gate oxide 35. Gate oxide 35 is especially thick to protect substrate 14 from etching when material 37 is subjected to the wet chemical etch process. Oxide 35 can be removed by a wet chemical etching process selective to oxide to reach top surface 43 of substrate 14. Additionally, etching of oxide 35 removes spacers 42 associated with gate structure 18. Alternatively, dry-etching techniques can be utilized to remove material 37 and oxide 35.

Figure 5:
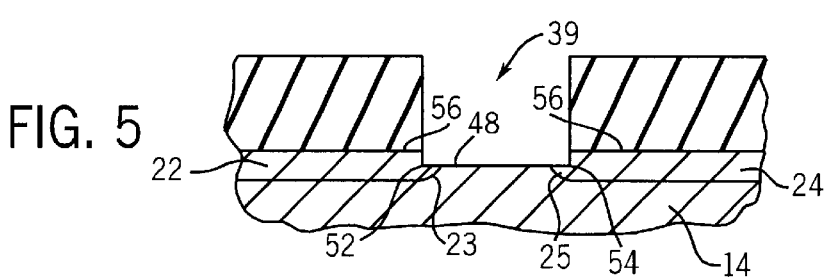
FIG. 5 is a cross-sectional view of the portion of the integrated circuit illustrated in FIG. 1, showing an etching step.

With reference to FIG. 5, substrate 14 is etched to form a recessed portion 48 in cavity 39. Recessed portion 48 includes corners 52 and 54, which engage source region 22 and drain region 24, respectively. Substrate 14 can be etched by any stripping or removal process, including plasma-etching, dry-etching, wet chemical etching, or reactive ion-etching. Substrate 14 is etched so cavity 39 is from 40–170 nm lower than top surface 56.

Recessed portion 48, in turn, forms ultra-shallow source and drain extensions 23 and 25. Preferably, source and drain regions 22 and 24 are approximately 100–200 nm below top surface 56 of substrate 14 and extensions 23 and 25 are between less than 30 and 60 nm thick. Accordingly, recessed portion 48 extends from approximately 40–170 nm below top surface 56.

With reference to FIG. 1, spacers 32 are preferably each 8–10 nm thick. Spacers 32 can be deposited by CVD and selectively etched after gate oxide 33 is formed. Gate oxide 33 is preferably a thin gate oxide having a thickness of approximately 2–5 nm.

Once spacers 32 are formed, conductor 36 is provided in cavity 39. Alternatively, transistor 12 can be manufactured without spacers 32. Conductor 36 is preferably provided as a conformal layer of doped polysilicon that is selectively etched to leave gate conductor 36 in structure 18. Alternatively, conductor 36 can be doped in a subsequent step. Conductor 36 can be any doped semiconductor material or conductor. Conductor 36 is preferably deposited as a 300–500 nm thick layer and is polished back to leave layer 38.

Thus, substrate 14 is over-etched to form ultra-shallow source and drain extensions 22 and 24, thereby circumventing problems associated with conventional ion implantation approaches. Conventional contacts, interconnects, and other CMOS processes can be utilized to complete the formation of the integrated circuit associated with portion 10 and transistor 12.

It is understood that, while preferred embodiments, examples, materials, and values are given, they are for the purpose of illustration only. The apparatus and method of the invention are not limited to the precise details and conditions disclosed. For example, although polysilicon and oxide material are discussed, other materials could utilized to create a transistor with ultra-shallow source and drain extensions. Thus, changes may be made to the details disclosed without departing from the spirit of the invention which is defined by the following claims.

What is claimed is:

1. A method of manufacturing an integrated circuit, comprising:
    providing a plurality of gate structures between a source region and a drain region in a semiconductor substrate, each of the gate structures including a dummy material between a pair of sacrificial spacers
    providing an insulative layer over the gate structures;
    polishing the insulative layer until the dummy material is exposed;
    removing the dummy material, thereby leaving a cavity between the sacrificial spacers;
    etching a recess in the substrate within the cavity and partially in the source region and in the drain region, whereby the recess forms an ultra-shallow source extension and an ultra-shallow drain extension, wherein the etching removes the sacrificial spacers;
    forming insulative spacers on walls of the cavity associated with the insulative layer; and
    providing a doped semiconductor material in the cavity.

2. The method of claim 1 wherein the sacrificial spacers are silicon dioxide.

3. The method of claim 2 further comprising:
    stripping a sacrificial oxide material disposed beneath the dummy material after the removing of the dummy material step; and
    forming a thin gate oxide layer in the cavity after the etching step.

4. The method of claim 1, wherein the removing step is a wet-etching step.

5. The method of claim 4, wherein the doped semiconductor material includes silicon.

6. The method of claim 3 wherein the sacrificial oxide material is 10 to 20 nm thick.

7. The method of claim 6, wherein the dummy material is undoped polysilicon.

8. The method of claim 1, wherein the sacrificial spacers are removed by wet etching.

9. The method of claim 6, wherein the doped semiconductor material is heavily doped with P-type dopants.

10. The method of claim 1, wherein the gate structure includes a sacrificial gate oxide being at least 20 nm thick.

11. A method of manufacturing an ultra-large scale integrated circuit including a plurality of field effect transistors, each transistor having a source, a drain, and a gate structure disposed between the source and the drain, the gate structure includes a first gate material disposed between sacrificial spacers and over a gate oxide, the method comprising steps of:
    depositing an insulative material over the top surface of the semiconductor substrate and over the gate structures;
    removing a portion of the insulative material to expose the first gate material;
    removing the first gate material from the gate structures;
    removing the sacrificial spacers;
    removing the gate oxide;
    etching the substrate underneath the gate oxide;
    providing a thin gate oxide;
    providing insulative spacers on sidewalls of the insulative material providing a second gate material between the insulative spacers in the gate structure.

12. The method of claim 11, wherein ultra-shallow source and drain extensions are formed by the etching step.

13. The method of claim 11, wherein the gate oxide has a thickness between 2–5 nm.

14. The method of claim 11, wherein the second gate material is doped polysilicon.

15. The method of claim 11, wherein the insulative material is deposited by low temperature chemical vapor deposition.

16. The method of claim 11, wherein the first gate material is removed in a wet-etching step.

17. A damascene gate process of forming shallow source and drain extensions, the process comprising steps of:
    providing a plurality of transistors, the transistors including a source region, a drain region, and at least a portion of a gate structure on a top surface of a silicon substrate, the gate structure including a gate conductor between sacrificial spacers and located between the source region and the drain region;
    covering the transistors with an insulative layer;
    removing the insulative layer to expose a top surface of the gate conductor;
    removing the gate conductor from the gate structure, thereby leaving a cavity in the gate structure;
    removing the sacrificial spacers;
    etching within the cavity to provide a recessed portion in the top surface of the substrate, thereby forming the shallow source and drain extensions; and
    providing insulative spacers in the cavity and abutting the insulative layer.

18. The process of claim 17, wherein the shallow source and drain extensions have a thickness of less than 30 nm.

19. The process of claim 18, further comprising providing a heavily doped polysilicon conductor in the cavity.

20. The process of claim 18, wherein the gate conductor is removed by wet-etching.

* * * * *